United States Patent [19]

Thillays et al.

[11] 3,717,800

[45] Feb. 20, 1973

[54] DEVICE AND BASE PLATE FOR A MOSAIC OF SEMICONDUCTOR ELEMENTS

[75] Inventors: Jacques Thillays, Herouville Saint Clair; Jacques Fertin, Caen, both of France

[73] Assignee: U.S. Philips Corporation, New York, N.Y.

[22] Filed: June 18, 1971

[21] Appl. No.: 154,556

[30] Foreign Application Priority Data

June 18, 1970 France....................7022499
June 18, 1970 France....................7022498

[52] U.S. Cl.........317/234 R, 317/235 N, 317/234 N, 174/68.5, 317/101 B, 317/235 D

[51] Int. Cl.....................H01l 15/00, H01l 19/00

[58] Field of Search...........317/235 N, 234 N, 101 B; 174/68.5

[56] References Cited

UNITED STATES PATENTS

| | | | |
|---|---|---|---|
| 3,413,603 | 11/1968 | Kimura | 340/146.3 |
| 3,654,476 | 4/1972 | Hakki | 250/211 J |
| 3,485,934 | 12/1969 | Prather | 174/68.5 |
| 3,562,592 | 2/1971 | Cooke et al. | 317/101 |
| 3,033,914 | 5/1962 | Acosta-Lleras | 174/68.5 |
| 3,502,507 | 3/1970 | Mann | 136/89 |

*Primary Examiner*—Martin H. Edlow
*Attorney*—Frank R. Trifari

[57] ABSTRACT

A mosaic of semiconductor elements on an insulating base plate including interconnections made by two groups of parallel and alternating conductive strips and a plurality of conductors orthogonal to the conductive strips. Each of the conductive strips in one group is connected to selected semiconductor elements for excitation and each of the orthogonally disposed conductors is connected to a selected conductive strip in the second group and selected semiconductor elements for excitation. The device can be made compact and compatible for use in alpha-numeric displays.

11 Claims, 2 Drawing Figures

INVENTORS
JACQUES THILLAYS
JACQUES FERTIN
BY
AGENT

INVENTORS
JACQUES THILLAYS
JACQUES PERTIN
BY
AGENT

DEVICE AND BASE PLATE FOR A MOSAIC OF SEMICONDUCTOR ELEMENTS

BACKGROUND OF THE INVENTION

The invention relates to a device comprising a mosaic of semiconductor elements which are secured to an insulating base plate and which are connected together by conductors oriented in a first of the directions consisting of a group of metallized strips on the base plate.

Certain so-called polylithic semiconductor devices comprise several elements arranged in a regular matrix and at given distances, for example, the electroluminescent devices for displaying alpha-numeric characters by combinations of stripes and dots. In prior art devices, the semiconductor device includes connection conductors at the output terminals thereof, the connection conductors, at their connection places, leaving the four sides of the rectangular region within which the mosaic of semiconductor elements is arranged. The semiconductor elements, usually diodes having *p-n* junctions, are secured, at one of their electrodes, to the metallized surfaces of a common insulating base plate. Electrical connection between the semiconductor elements and their connection conductors is achieved by wiring printed on the base plate by metallization and by means of cónductive wires generally secured by thermo-compression. Thus, in prior art polylithic devices for displaying characters with electroluminescent diodes placed in columns and rows according to a so-called XY-matrix, the output connections of each assembly that corresponds to a character, comprise connection conductors that extend in the X- and in the Y- direction beyond the rectangular region comprising the semiconductor element mosaic.

Where the semiconductor elements are diodes, all the regions of the same conductivity type of the diodes of one column are connected together by conductors and all the regions of the opposite conductivity type of the diodes of one row are connected together by other conductors. Each diode can be excited by supplying a voltage between the respective conductors of the column and of the row containing the particular diode. To ensure the insulation between the various connections between such conductors and the abovementioned connection places of the device connection conductors, the dimensions of the base plate must be much larger than those of the displayed character, even if such connection places of the device are arranged only along the short sides of a rectangular base plate; for example, a device which can display a character of 5 mm width comprises a matrix-enclosing box having an overall width on the order of 15 mm. When several devices are placed beside each other for displaying a number of several digits or a word of several letters, the intermediate space between the digits and the letters is too large to ensure a good legibility.

OBJECT OF THE INVENTION

It is an object of the invention to mitigate the abovementioned drawbacks and to manufacture polylithic semiconductor devices (comprising semiconductor elements) arranged in rectangular boxes of minimum width, and in particular such devices comprising a mosaic of elements placed in columns and rows according to a so-called XY-matrix and at a constant distance in each of the two directions.

SUMMARY OF THE INVENTION

The invention includes a device comprising an insulating base plate on a surface of which are disposed two groups of conductors, one of which groups of conductors includes substantially parallel metallized first strips extending in a first direction and the other of which groups includes metallized second strips, the metallized second strips being parallel to and alternate in location with the metallized first strips. The device further comprises a mosaic of semiconductor elements secured to the insulating base plate and connected to each other by the metallized first strips and by a third group of conductors, the third group of conductors being oriented in a second direction substantially orthogonal to the first direction and being connected to various connection conductors via the metallized second strips.

Thus, all the connections between the semiconductor elements and the beginning of the connection conductors, which connect the elements to the output terminals, are located in the rectangular region within which the mosaic is provided and it is possible to restrict the inner width of the device box to the width of the mosaic. The box, corresponding to the mosaic width, then comprises at the sides thereof no connection between the semiconductor elements and the beginning of the connection conductors. As a result, the outer width of the base plate and, consequently, that of the box are minimum for a given width of the mosaic, and when several devices are placed beside each other, the mosaics are close together. The ratio between the surface of the mosaic and that of the device is larger than in the known device.

In one embodiment, one of the respective electrodes of the various semiconductor elements is secured to a metallized first strip and the third group of conductors comprises soldered wires. In another embodiment, the metallized first and second strips are substantially equal in length, viz., at least the length of the rectangular region containing the semiconductor mosaic it being preferred that at least some of the metallized first and second strips extend beyond the rectangular region.

DESCRIPTION OF THE PREFERRED EMBODIMENTS

In a preferred embodiment of the invention (FIG. 1), the semiconductor elements are arranged in rows and columns to form a so-called XY-mosaic with one of their respective electrodes soldered to a first group of conductors, preferably metallized strips, oriented in the Y-direction. Alternating with and parallel to the first group of strips are the second group of conductors, preferably in the form of metallized strips whose lengths differ mutually, reach the level of the various rows of elements, to which elements the second group of strips are connected by conductors comprising a third group. The conductors of the third group are oriented in a second direction orthogonal to direction of the first group, namely the X-direction, and preferably are connected by soldering to another electrode of the semiconductor elements. If desirable two strips of the second group may be in alignment, as in FIG. 1, which does not change the overall width of the base plate and of the device.

Figure 1:
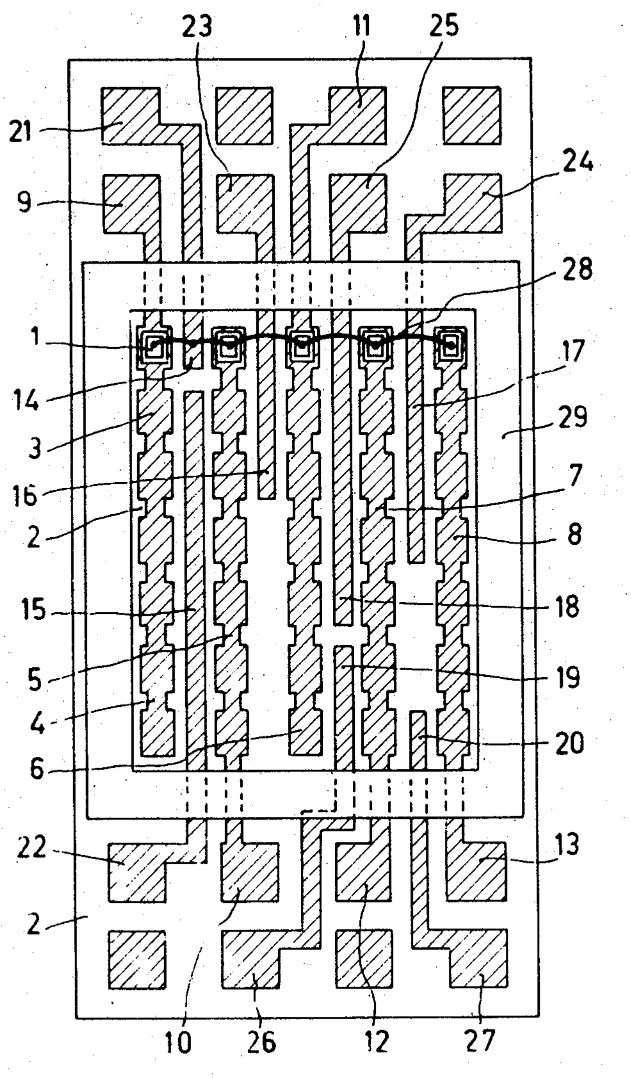
FIG. 1 is a plan view of a part of the device according to the invention.

More specifically, in the preferred embodiment shown in FIG. 1, the device comprises 35 semiconductor elements which are arranged in the XY-direction in five columns of seven rows. In FIG. 1 for simplicity, only the five elements of the same row are shown in the form of electroluminescent monocrystals 1 which are secured at one of their electrodes to the metallized surfaces 3, which metallized surfaces 3 have been obtained by the local deposition of a conductive metal on an insulating base plate 2. The metallized surfaces for the elements of the same column are connected together and constitute continuous strips 4, 5, 6, 7 and 8, which correspond to, respectively, the five columns of semiconductor elements of the device. These five strips 4, 5, 6, 7 and 8 each change into respective metallic pads of a larger area, which pads provide the connection places 9, 10, 11, 12 and 13, respectively, where terminal contacts, soldered wires or any other means of contact can be secured.

Between the above-specified strips 4 through 8, there are arranged other metallized strips 14 through 20 that have the same orientation as the strips 4 through 8 and also changing into metallic pads of a larger area that provide connection places 21 through 27. These other strips 14 through 20 have different lengths, each strip being restricted so that its end is at the level of a certain row. In this embodiment the strip 14 extends to level of the first row. Strip 15 is aligned with strip 14 and extends to the level of the next row, while strip 16 extends to the level of the third row, and the strips 17, 18, 19 and 20 extend to the level of various following rows, respectively. Each of the strips 14 to 20 is connected to a contact pad, i.e., the connection places 21 to 27, respectively.

The semiconductor elements of the same row, for example, those of the row with the elements denoted by 1, have their second electrodes connected together and to at least one of the above-described other strips 14 through 20, by means of conductors which are oriented in a direction orthogonal to the metallized strips 4 through 8 on the insulating base plate and which are insulated from all of the other strips 4 through 8 and 14 through 20 to which they are not connected. Such a conductor is, for example, a wire 28 which is soldered by thermocompression in accordance with the so-called chain method, thus providing a conductor oriented in the second direction perpendicular to the strips.

Thus in the XY-mosaic in FIG. 1, all the outputs are directed parallel to the connection places 9 through 13 and 21 through 27 of the device (the connection places preferably being located opposite the short sides of the frame, or rectangle, 29 within which the mosaic is arranged) and the mosaic is accessible, via the connection places, from two oppositely located sides, namely, the preferred short sides of the rectangle 29. A device box containing the XY-mosaic and comprising the frame 29 and a suitable cover, as described below, has a minimum width, and two such devices can be placed side by side with minimum intermediate space. For example, in a device for displaying characters, consisting of a mosaic or electroluminescent diodes which are arranged and connected according to an XY-matrix, the display of combinations of luminous dots of a letter of 5 mm width results in a box of 10 mm outer width and the distance between two letters, in the case of several independent devices placed side by side, is smaller than the width of a letter, which corresponds to the optimum legibility.

The base plate 2 of the device is preferably made from a ceramic material, and rigid insertable pins (not shown) can be secured to the base plate on either side of the mosaic. The connections between the pins and the metallized strips of the two groups consist of metallized tracks which are in alignment with the strips and extend to the metallized pads e.g., 10, 12, etc. which are present in the places of the pins and ensure a good contact with the pins. Metallizing the strips, tracks and pads is carried out as described above.

To protect the semiconductor elements from the atmosphere and from any deposit which might spoil them, the matrix of semiconductor elements can be enveloped with a suitable material, such as by a box comprising a frame 29 provided on the base plate in an insulating manner and a cover (not shown) which is transparent in the case of electroluminescent elements and is secured to the frame 29 in an insulating manner. The base plate 2 and the frame 29 are, for example, of ceramic material and the cover is of glass. In the case of a frame, such as that of FIG. 1, the passages below the frame 29 of the metallized strips on the base plate 2 are insulated. The metallization is realized, for example, by the deposition of suitable materials, such as molybdenum and manganese, according to the conventional methods, the pattern of the strips being obtainable by photoetching and the strips being gold-plated.

Figure 2:
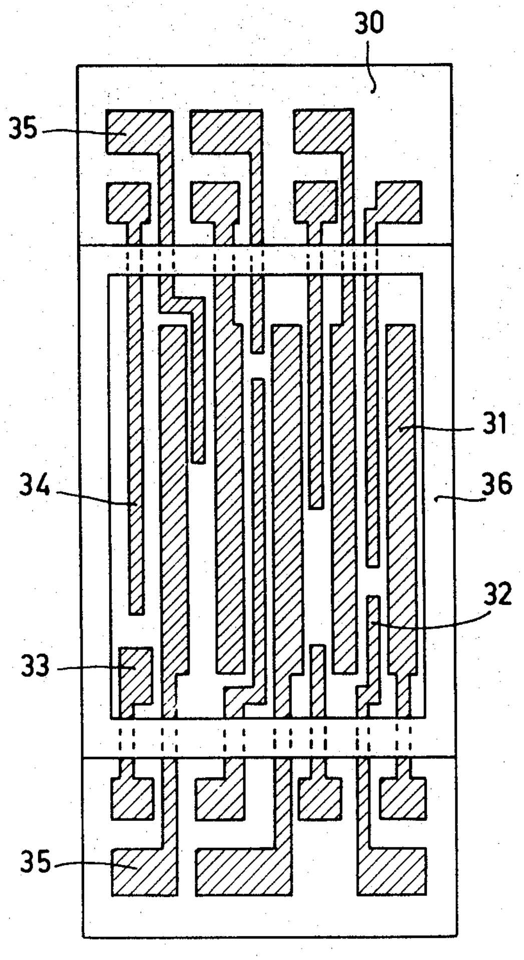
FIG. 2 is a plan view of a part of another device according to the invention.

FIG. 2 shows a part of another device for displaying characters with electroluminescent elements in an XY-matrix as in FIG. 1, prior to mounting the elements. A base plate 30 is locally metallized alternately to provide thereon two rows of parallel strips 31 and 32. The semiconductor elements of a column are secured on each of strips 31, and strips 32 which are of different lengths, each extend to the level of a different row of the subsequently provided semiconductor elements. The device comprises, moreover, a metallized surface 33 to which can be fixed one or several additional elements which serve to form a decimal point (or comma). A strip 34 of the same type as the strips 32 serves to connect the second electrode of the additional element to one of the connection places 35 to which the strips 31 and the strips 32 are also connected. The connection places 35 serve as connection means to the external circuits of the type which is chosen for the device, for example, rigid or flexible pins. A frame 36 is secured to the base plate 30 for receiving a transparent cover to protect the elements.

It has been found that in the two above-described devices, the overall width of the base plate lies near that of the letter to be displayed and that it is possible with such devices to display letters very close together, the advantage of the use of independent unitary devices being maintained. The optimum ratios between length, width and intermediate space of the characters may be observed and ensures the best legibility.

The construction of the connection conductors to the connection places according to the invention makes it possible also to provide pins on restricted surfaces of the base plate, a sufficient intermediate space being maintained between the pins. For example, the devices described with reference to FIGS. 1 and 2, can be provided with an insertion pin at the area of each of the connection places, these being provided with the desired intermediate spaces, preferably corresponding to a standardized distance, of, for example, 2.54 mm.

Generally, all of the metallized strips of the second group of conductors (which are on the base plate and are connected to the orthogonally oriented conductors) preferably have the same length as the strips of the first group on the base plate, namely at least the length of the rectangular region within which the mosaic is arranged; by extending the various strips on either side thereof, each of these metallized strips is connected to a connection place, either at one end, or at the other end, or even at both ends. If the number of connections to the connection places of the device necessitates this, it is possible to juxtapose two strips of the second group in the intermediate spaces between two strips of the first group.

The invention may be applied in particular to dot matrices having electroluminescent diodes placed in the XY-direction. It may also be applied to all matrices with points or strips of polylithic structure with semiconductor elements having two electrodes or furthermore those which are provided on flat base plates.

When the elements of the mosaic each have two electrodes, one group of metallized strips on the substrate serves as the connections for the first electrodes and the second such group as the connections for the other electrodes. As a result of this the invention is particularly suitable for manufacturing XY-matrices having electroluminescent diodes of 5 × 7 dots, the mutual connections in the Y-direction being ensured by the five strips of the first group which mutually have four available intermediate spaces, so that there exist eight connection possibilities for the strips of the second group; as a result of this, the seven connections of the intermediate connection conductors (comprising the second group) to the corresponding terminals are easily provided in the available intermediate spaces.

When the semiconductor elements of the mosaic each have three electrodes, for example, in the case of transistors, the first of the metallized groups serves to connect the first electrodes of various semiconductor elements, preferably by direct connection of the semiconductor elements on the strips of the first group. A part of the strips of the second group connect the intermediate connections (i.e., via conductors orthogonally oriented with respect to the first conductors) between the second electrodes to various ones of the connection places (e.g., 10, 12, etc. in FIG. 1) and the other strips of the second group connect the intermediate connections (i.e., via other such orthogonally oriented conductors) between the third electrodes to other ones of the connection places.

A base plate assembly produced according to the present invention, for a device including a mosaic of semiconductor elements arranged within the boundaries of a rectangular region of the base plate assembly, comprises metallized conductive strips on one of the large surfaces of the base plate, characterized in that within the rectangular region the conductive strips are all parallel and distributed between at least two groups, one of which groups consists of uninterrupted strips extending from one side of an oppositely located side of the region, while the second group consists of interrupted strips of different lengths which are arranged alternately between the strips of the first group.

The conductive strips of the base plate assembly made according to the invention enable an optimum use of the surface of the rectangular region, in which a mosaic of elements can be placed. With the two groups which are formed by the strips it is possible to connect each of the considered semiconductor elements by two different conductors extending to different terminals. In the case in which a mosaic is provided of elements placed according to the dots of, for example, an XY-matrix, the elements can be connected in columns arranged in one of the two directions by means of the strips of the first group, and in rows arranged in the other direction by means of, for example, wire-shaped conductors which are added after the elements have been provided in their places. The strips of the second group serve to return the connections from the latter (i.e., wire-shaped) conductors to the connection places in the same direction as the strips of the first group. The connection conductors and the connection places of the device manufactured on the base plate project only on two oppositely located sides beyond the rectangular region within which the mosaic is provided and thus require a smaller base plate area than that of the known devices and permit a better ratio of their dimensions.

In certain intermediate spaces between strips of the first group, at least two strips of the second group are preferably provided in alignment, as illustrated in FIGS. 1 and 2. Such an arrangement makes it possible to arrange the end of the strips of the second group at a double number of levels and thus to increase the connection possibilities.

It is obvious that in the case in which the number of output connections to be ensured by the strips of one or the other group makes it necessary, it is possible to arrange two strips of the same group in an intermediate space present between two strips of the other group.

We claim:

1. A device including a mosaic of semiconductor elements, comprising:

a. an insulating base plate comprising connection places thereon;

b. a first and a second group of substantially parallel electrically conducting elements disposed on said insulating base plate, said electrically conducting elements of said second group alternating in location with said elements of said first group;

c. said mosaic comprising at least two rows of said semiconductor elements secured to said insulating base plate, various ones of said semiconductor elements being electrically interconnected by respective elements of said first group; and d. a third group of electrically conducting elements oriented orthogonally with respect to said first group of elements and individually connected to respective electrically conducting elements of said second group, said third group of elements further electrically interconnecting various ones of said semiconductor elements and being electrically connected to said connection places by said second group of elements.

2. A device as defined in claim 1, wherein said semiconductor elements individually comprise at least a first and a second electrode, said first group of electrically conducting elements being electrically connected to various ones of said first electrodes and said third group of such elements being electrically connected to various ones of said second electrodes.

3. A device as defined in claim 1, wherein said first and second groups of electrically conducting elements comprise metallized strips.

4. A device as defined in claim 3, wherein various ones of said second group of electrically conducting elements vary in length so as to reach their respective said electrically conducting elements of said third group.

5. A device as defined in claim 3, wherein said strips of said first and second groups are substantially equal in length.

6. A device as defined in claim 3, wherein at least two metallized strips of said second group are disposed between two adjacent ones of said first group of metallized strips and are aligned with each other.

7. A device as defined in claim 3, wherein at least one of said metallized strips comprises a connection place at at least one end thereof.

8. A device as defined in claim 7, wherein said connection place comprises a metallized pad.

9. A device as defined in claim 3, wherein said semiconductor elements individually comprise a first, a second, and a third electrode, said first group of electrically conducting elements being electrically connected to various ones of said first electrodes, a portion of said third group of said electrically conducting elements being connected to various ones of said second electrodes, and others of said third group of elements being connected to various ones of said third electrodes.

10. A device as defined in claim 1, wherein said semiconductor elements comprise an XY-matrix.

11. A base plate assembly for a device comprising a mosaic of semiconductor elements within a rectangular region on said assembly, said assembly comprising an insulating base plate comprising a large surface including said rectangular region and at least two groups of parallel metallized conductive strips disposed at said rectangular region, one of said groups comprising uninterrupted said conductive strips extending from one side of said region to an oppositely located such side and the other of said groups comprising interrupted said conductive strips of different lengths arranged alternately between said conductive strips of said first group, said one group being adapted to be electrically connected to the respective first electrodes of said semiconductor elements and said other group being adapted to be electrically connected to respective second electrodes of said semiconductor elements.

* * * * *